United States Patent
Scott et al.

(10) Patent No.: US 8,629,725 B2
(45) Date of Patent: Jan. 14, 2014

(54) POWER AMPLIFIER HAVING A NONLINEAR OUTPUT CAPACITANCE EQUALIZATION

(75) Inventors: Baker Scott, San Jose, CA (US); George Maxim, Milpitas, CA (US); Chu Hsiung Ho, Milpitas, CA (US); Stephen Franck, Felton, CA (US); Tom Biedka, San Jose, CA (US)

(73) Assignee: RF Micro Devices (Cayman Islands), Ltd., Greensboro, NC (US)

( * ) Notice: Subject to any disclaimer, the term of this patent is extended or adjusted under 35 U.S.C. 154(b) by 38 days.

(21) Appl. No.: 13/310,568

(22) Filed: Dec. 2, 2011

(65) Prior Publication Data

US 2012/0146722 A1   Jun. 14, 2012

Related U.S. Application Data

(60) Provisional application No. 61/419,856, filed on Dec. 5, 2010.

(51) Int. Cl.
*H03F 3/191* (2006.01)

(52) U.S. Cl.
USPC .......................................... 330/305; 330/310

(58) Field of Classification Search
USPC .................... 330/192, 302, 305, 306
See application file for complete search history.

(56) References Cited

U.S. PATENT DOCUMENTS

| | | |
|---|---|---|
| 2,681,953 A | 6/1954 | Bradburd |
| 2,797,267 A | 6/1957 | Yost, Jr. |
| 3,151,301 A | 9/1964 | Bettin |
| 3,287,653 A | 11/1966 | Goordman |
| 3,441,865 A | 4/1969 | Siwko |
| 3,524,142 A | 8/1970 | Valdettaro |
| 3,959,603 A | 5/1976 | Nilssen et al. |
| 4,032,973 A | 6/1977 | Haynes |
| 4,087,761 A | 5/1978 | Fukumoto et al. |
| 4,232,270 A | 11/1980 | Marmet et al. |
| 4,511,857 A | 4/1985 | Gunderson |
| 4,772,858 A | 9/1988 | Tsukii et al. |
| 4,791,421 A | 12/1988 | Morse et al. |
| 4,977,366 A | 12/1990 | Powell |
| 5,023,566 A | 6/1991 | El-Hamamsy et al. |
| 5,412,344 A | 5/1995 | Franck |
| 5,521,561 A | 5/1996 | Yrjola et al. |
| 5,589,796 A | 12/1996 | Alberth, Jr. et al. |
| 6,060,752 A | 5/2000 | Williams |
| 6,271,727 B1 | 8/2001 | Schmukler |
| 6,411,098 B1 | 6/2002 | Laletin |
| 6,696,902 B2 | 2/2004 | Lerke et al. |
| 6,741,483 B1 | 5/2004 | Stanley |
| 6,828,862 B2 | 12/2004 | Barak |
| 6,841,981 B2 | 1/2005 | Smith et al. |
| 6,990,357 B2 | 1/2006 | Ellä et al. |

(Continued)

*Primary Examiner* — Khanh V Nguyen
(74) *Attorney, Agent, or Firm* — Withrow & Terranova, P.L.L.C.

(57) ABSTRACT

Power amplifier (PA), regardless of the process used for the manufacturing of its devices, suffers from a nonlinear output capacitance that has significant impact on various aspects of the PA performance. This output capacitance is dependent on the large output voltage swing. Accordingly a compensation capacitance is added at the output of the PA that has a behavior that is inverse respective of the output voltage of that of the output capacitance of the PA. Connecting the compensation capacitor in parallel to the PA output capacitance, results in a total capacitance that is the sum of the output capacitance and its compensation capacitance. The total output capacitance is therefore essentially stable throughout the output voltage swing.

10 Claims, 5 Drawing Sheets

(56) References Cited

U.S. PATENT DOCUMENTS

| | | |
|---|---|---|
| 7,003,265 B2 | 2/2006 | Jeon et al. |
| 7,079,816 B2 | 7/2006 | Khorram et al. |
| 7,120,399 B2 | 10/2006 | Khorram |
| 7,138,872 B2 | 11/2006 | Blednov |
| 7,151,411 B2 * | 12/2006 | Martin et al. ............... 330/305 |
| 7,155,252 B2 | 12/2006 | Martin et al. |
| 7,180,373 B2 | 2/2007 | Imai et al. |
| 7,187,945 B2 | 3/2007 | Ranta et al. |
| 7,245,887 B2 | 7/2007 | Khorram |
| 7,260,363 B1 | 8/2007 | Snodgrass |
| 7,269,441 B2 | 9/2007 | Ellä et al. |
| 7,292,098 B2 | 11/2007 | Chen et al. |
| 7,315,438 B2 | 1/2008 | Hargrove et al. |
| 7,365,605 B1 | 4/2008 | Hoover |
| 7,420,416 B2 | 9/2008 | Persson et al. |
| 7,420,425 B2 | 9/2008 | Tsai |
| 7,449,946 B1 | 11/2008 | Hoover |
| 7,468,638 B1 | 12/2008 | Tsai et al. |
| 7,623,859 B2 | 11/2009 | Karabinis |
| 7,639,084 B2 | 12/2009 | Liao et al. |
| 7,652,464 B2 | 1/2010 | Lang et al. |
| 7,663,444 B2 | 2/2010 | Wang |
| 7,768,350 B2 | 8/2010 | Srinivasan et al. |
| 7,869,773 B2 | 1/2011 | Kuijken |
| 7,890,063 B2 | 2/2011 | Ahn et al. |
| 7,911,277 B2 * | 3/2011 | Paul et al. ............... 330/305 |
| 7,920,833 B2 | 4/2011 | Qiao et al. |
| 7,924,209 B2 | 4/2011 | Kuo et al. |
| 7,948,305 B2 | 5/2011 | Shirokov et al. |
| 7,986,186 B2 | 7/2011 | Marbell et al. |
| 8,027,175 B2 | 9/2011 | Liu et al. |
| 8,072,272 B2 * | 12/2011 | Zhao et al. ............... 330/310 |
| 8,319,549 B2 * | 11/2012 | Sengupta et al. ............... 330/2 |
| 2003/0078011 A1 | 4/2003 | Cheng et al. |
| 2003/0193371 A1 | 10/2003 | Larson et al. |
| 2005/0052296 A1 | 3/2005 | Manlove et al. |
| 2005/0122163 A1 | 6/2005 | Chu |
| 2007/0008236 A1 | 1/2007 | Tillery et al. |
| 2007/0075784 A1 | 4/2007 | Pettersson et al. |
| 2008/0102762 A1 | 5/2008 | Liu et al. |
| 2008/0129642 A1 | 6/2008 | Ahn et al. |
| 2009/0073078 A1 | 3/2009 | Ahn et al. |
| 2009/0195946 A1 | 8/2009 | Kleveland |
| 2009/0296855 A1 | 12/2009 | Kitamura et al. |
| 2010/0063497 A1 | 3/2010 | Orszulak |
| 2010/0105340 A1 | 4/2010 | Weissman |
| 2010/0203922 A1 | 8/2010 | Knecht et al. |
| 2010/0321096 A1 | 12/2010 | Sudjian |
| 2011/0025408 A1 | 2/2011 | Cassia et al. |
| 2011/0074509 A1 | 3/2011 | Samavedam et al. |
| 2011/0143690 A1 | 6/2011 | Jerng et al. |
| 2011/0148521 A1 | 6/2011 | Albers et al. |
| 2011/0199146 A1 | 8/2011 | Bakalski et al. |
| 2011/0242858 A1 | 10/2011 | Strzalkowski |
| 2012/0049925 A1 | 3/2012 | Ha et al. |

* cited by examiner

US 8,629,725 B2

POWER AMPLIFIER HAVING A NONLINEAR OUTPUT CAPACITANCE EQUALIZATION

CROSS-REFERENCE TO RELATED APPLICATIONS

This application claims the benefit of U.S. Provisional Patent Application No. 61/419,856 filed Dec. 5, 2010.

BACKGROUND OF THE INVENTION

1. Field of the Invention

The invention generally relates to power amplifiers (PAs) and more particularly to methods of equalizing the nonlinear output capacitance characteristics of PAs.

2. Prior Art

The output of a power amplifier (PA), for example that of PA 120 shown in FIG. 1 part A, is subject to a large voltage swing and hence to a non-linear behavior of the output capacitance 120 of the PA. In CMOS output stages where devices are often in cascode configuration this effect is complicated by the stack of devices having individual operating regions versus this output swing. The output voltage moves the devices of the output leg of the PA through the entire operating region, namely ON active, ON triode (linear), and OFF regions. This results in a large variation of their device capacitances. Furthermore, as the output voltage travels to the minimum value, i.e., close to 0V, progressively the cascode devices and finally also the main transconductance device enter a deep triode regime, presenting a very small equivalent resistance as compared to the high output impedance characteristic when the output stage devices are in the ON active region of operation.

When the output voltage is large and the output leg devices are active or off, the different drain-to-bulk and source-to-bulk diode capacitances and the gate to channel capacitances are isolated one from the other by a relatively large impedance. Therefore, the PA output capacitance is low, dominated by the last high-voltage (HV) cascode device. When the cascode device goes into the triode region the drain-to-bulk and the source-to-bulk capacitances are essentially merged by the device low on resistance and also add to the drain-to-bulk capacitance of the lower device. Also, the channel capacitance changes contribute to the nonlinearity of the output capacitance of the PA. Overall this increases significantly the PA output capacitance, as the lower devices go into triode region the PA output capacitance continues to increase towards the maximum value. This behavior of the output capacitance versus the output voltage is shown in FIG. 1 part B.

The nonlinear behavior of the output capacitance of the PA has a critical impact on the PA performance. It influences the peak output voltage and thus the maximum voltage stress of the output leg devices, the distortion, the frequency of oscillation of the output cascode device, the impedance matching as well as the harmonic filer performance. This characteristic is encountered in all PA technologies including, but not limited to, MOS, bipolar, HBT, III-V, etc. Therefore, in view of the deficiencies of the prior art, it would be advantageous to provide a solution that overcomes these deficiencies.

DETAILED DESCRIPTION OF THE PREFERRED EMBODIMENTS

Power amplifier (PA), regardless of the process used for the manufacturing of its devices, suffers from a nonlinear output capacitance that has significant impact on various aspects of the PA performance. This output capacitance is dependent on the large output voltage swing. Accordingly a capacitance with an inverse voltage coefficient of capacitance, i.e., a compensation capacitance, is added at the output of the PA that reduces the cumulative capacitance voltage coefficient at the PA output. Connecting the compensation capacitor in parallel to the PA output capacitance results in a total capacitance that is the sum of the output capacitance and compensation capacitance. The total output capacitance is therefore essentially stable throughout the output voltage swing.

Figure 1:
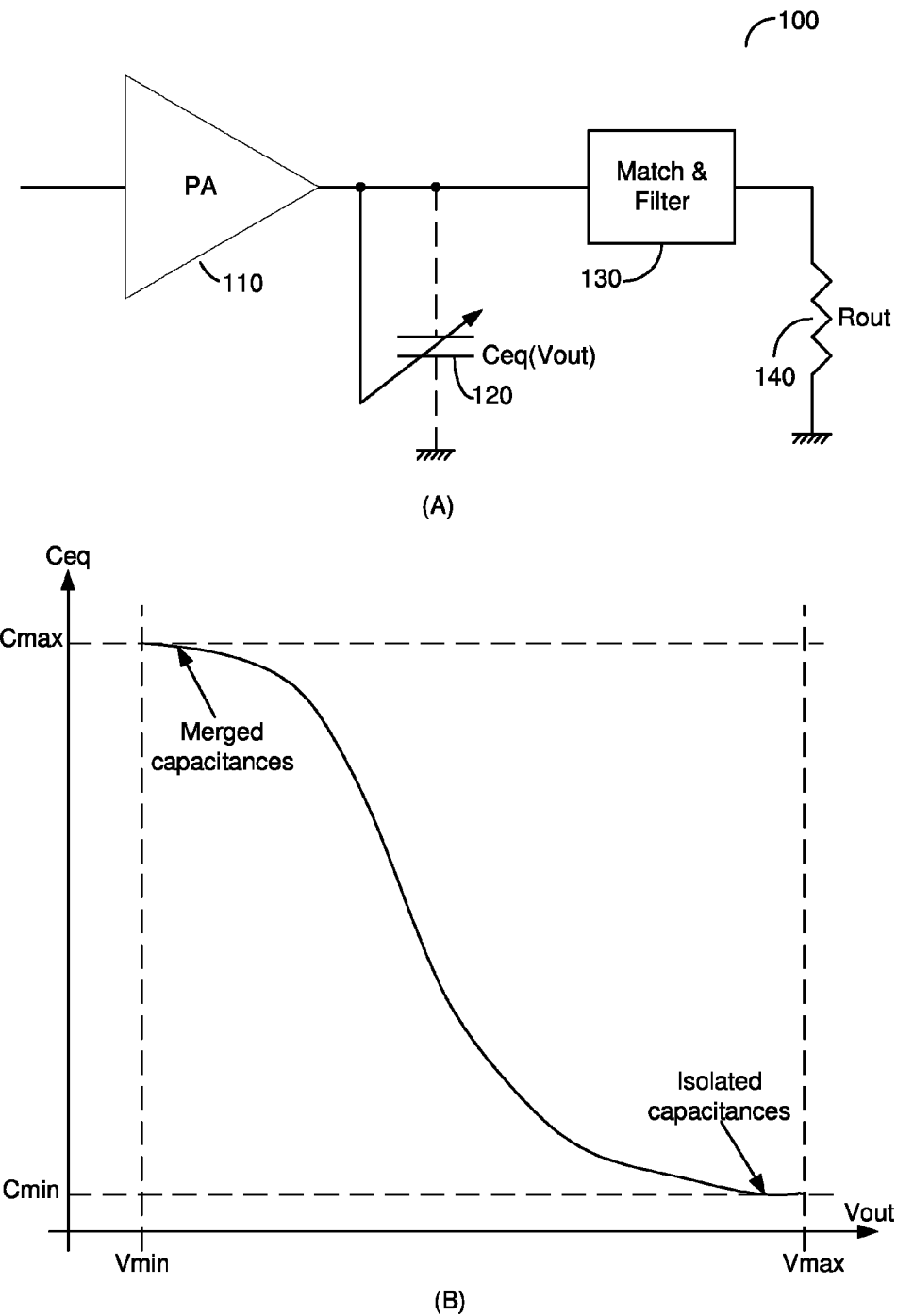
FIG. 1 is a diagram of a power amplifier having a nonlinear output capacitance and the curve showing capacitance behavior versus output voltage.
Figure 2:
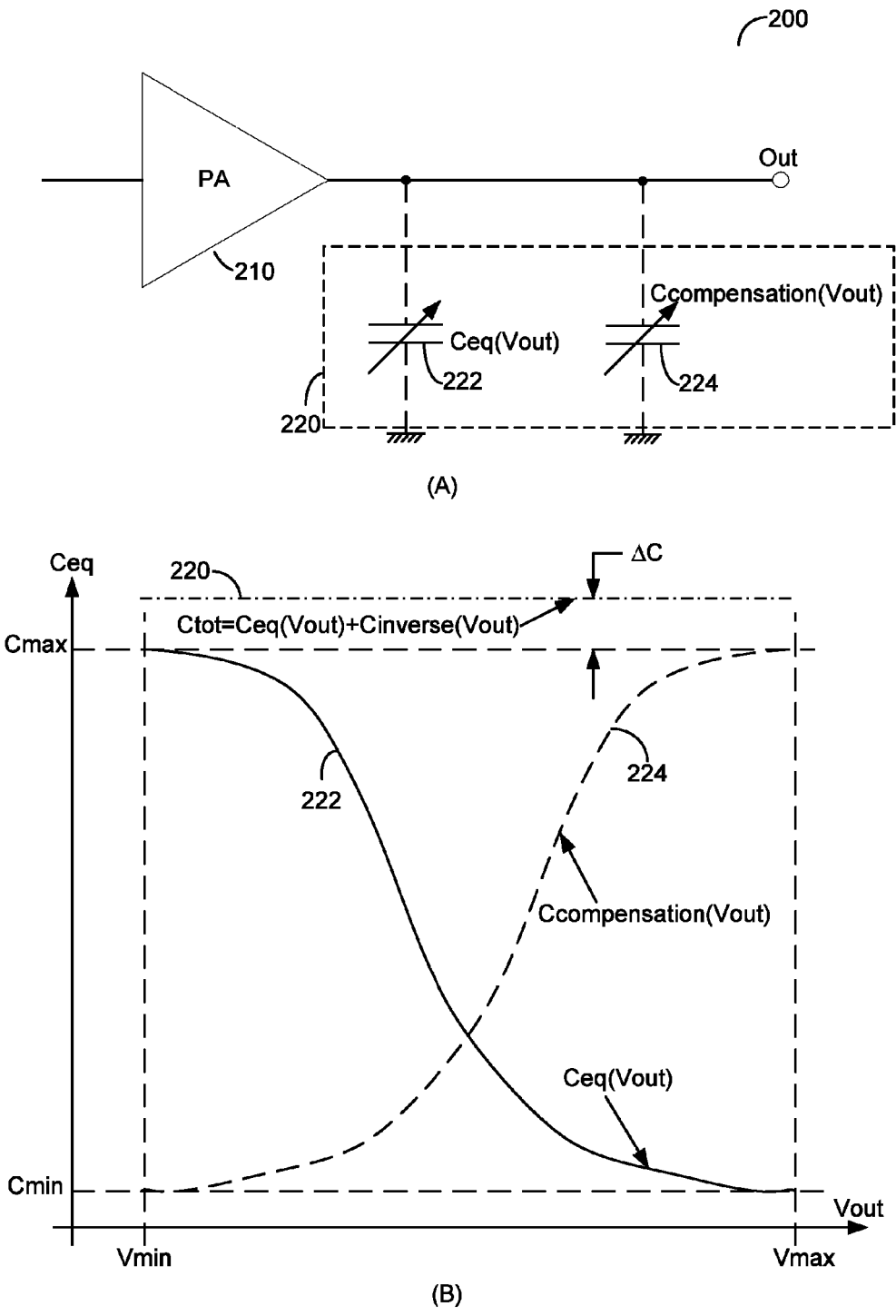
FIG. 2 is a diagram of a power amplifier having a nonlinear output capacitance linearized in accordance with a first principle of the invention and the respective curves showing capacitances behavior versus output voltage.

Reference is now made to FIG. 2 that depicts an exemplary and non-limiting diagram 200 of a power amplifier having a nonlinear output capacitance linearized in accordance with the principles of the invention (part A) and the curves showing capacitances behavior versus output voltage, or power for that matter (part B). Specifically the PA 210 has an output capacitance Ceq 222 that varies dependent on the output voltage swing and is nonlinear in nature, as discussed hereinabove. A compensating variable capacitor Ccompensation 224 that is controlled by the voltage output swing is connected in parallel to the output of the PA thereby effectively having the capacitor Ceq 222 and Ccompensation 224 connected in parallel. The total capacitance Ctot 220 is therefore the sum of the two capacitors Ceq 222 and Ccompensation 224. The curve of Ceq 222 are shown in part B of FIG. 1 and are essentially such that the capacitance is maximal at Vmin and minimal at Vmax. The curve of Ccompensation 224 has the opposite characteristic such that the capacitance is minimal at Vmin and maximal at Vmax. The curves are such that when the capacitance as summed up the total capacitance value is essentially constant, that is:

$$Ctot = Ceq + Ccompensation \approx const.$$

Adding Ccompensation 224 adds a certain capacitive load (ΔC) to the maximum capacitance load otherwise experienced by the PA which can mistune the PA and degrade the PA efficiency. This requires careful tuning of the match and filter network 130

It should be noted that realizing precise nonlinear capacitance compensation over design corners, that include process, temperature, voltage, etc., is virtually impossible and actually not advised. It should be further noted that a better efficiency can be achieved by allowing the total PA output capacitance to have some variability around the constant value.

Since it is desirable to minimize the maximum total output capacitance it is beneficial to use an equalization block 224 that has negligible capacitance at low Vout but is able to compensate most of the Ceq(Vout) nonlinearity at maximum Vout values. Although the equalization may not be perfect as desired and shown in FIG. 2 part B, such a technique results in better efficiency and only a small increase of the peak output voltage versus a perfectly constant total PA output capacitance. In practice it is sufficient to ensure that the total PA output capacitance stays within a given banded interval, preferably around the ideal constant capacitance value. Stable output capacitance also helps in the tuning of the output stage insuring that any resonances in the PA output stay consistent and can be designed for stable operation over the full power range of the PA.

Figure 3:
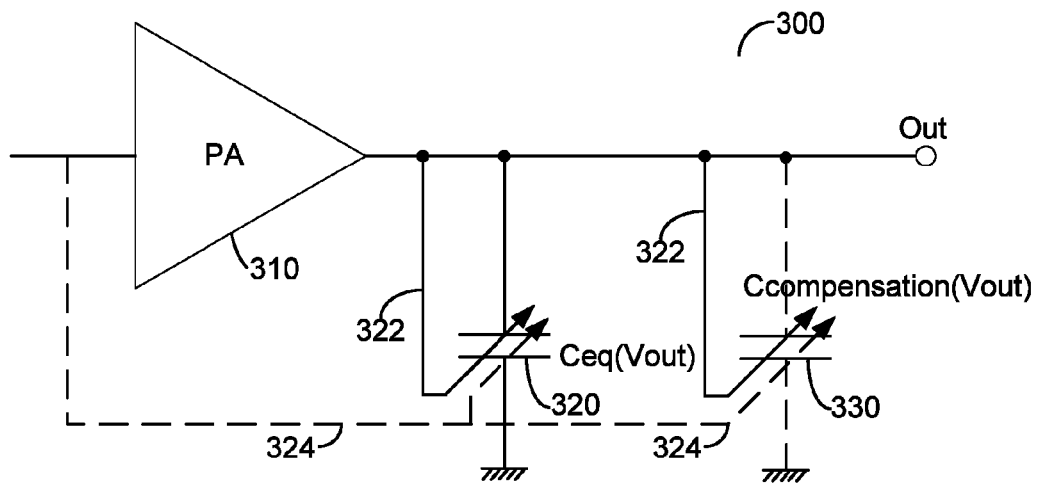
FIG. 3 is a diagram of a power amplifier having a nonlinear output capacitance linearized in accordance with a second principle of the invention.

Since the main dependence of the PA native nonlinear output capacitance is on the output voltage values, the simplest embodiment of the nonlinear capacitance linearization in accordance with the principles of the invention is by using a compensation block having a single control voltage input as shown with respect of FIG. 2, where the control is dependent on the output voltage. However, in some PA architectures the nonlinear output capacitance may experience a secondary dependence on a voltage different from the output voltage. One such case is shown in the exemplary and non-limiting FIG. 3 depicting a diagram 300 of a PA 310 having a nonlinear output capacitance 320 linearized in accordance with a second principle of the invention. In this case the output capacitance is also dependent on the input voltage to the PA 310. Therefore the linearizing block 330 has to be controlled by both the input voltage 322 and the output voltage 324 in order to compensate for both the primary affect of the output voltage on the output capacitance as well as the secondary affect of the input voltage on the output capacitance. In another embodiment the second control part of the equalization capacitance 332 can be controlled by the load impedance value, e.g., through a voltage standing-wave ratio (VSWR) detector.

In saturated PAs the AM to PM distortion does not have much relevance since the amplitude of the signal is held constant or approximately constant. In this case the nonlinear capacitance equalization if performed mostly for reducing peak voltage amplitude and improving stability. Therefore, equalizing only the PA output capacitance is usually good enough. However, in the linear PAs case the AM to PM can be a significant contributor to the overall distortion performance. The AM to PM distortion in a linear PA having multiple stages can happen in multiple nodes. Therefore it is usually the case the linear PAs need nonlinear capacitance equalization at several nodes. Moreover, the nonlinearity of the PA may occur also at earlier nodes, not only the output node, even though that is the node that sees the maximum voltage swing and hence the output capacitance nonlinearity dominates.

Figure 4:
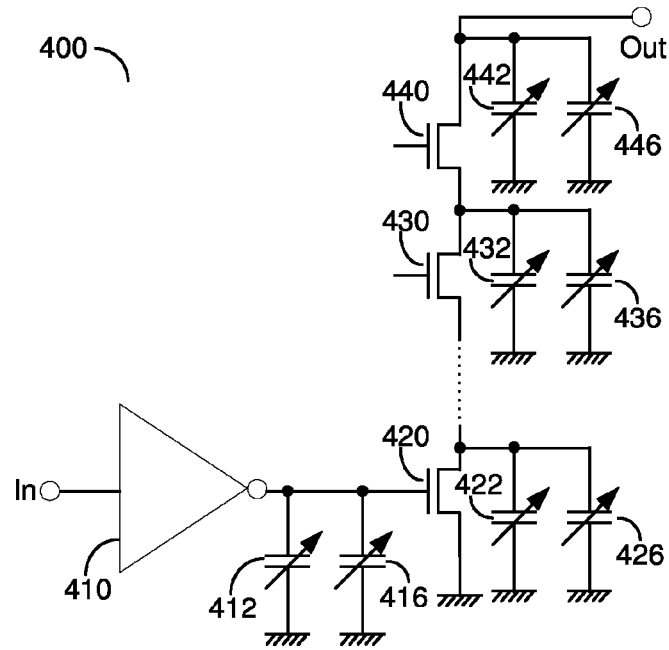
FIG. 4 is a schematic diagram of a PA having nonlinear capacitance at multiple nodes in the stacked cascode structure and respective inverse compensation capacitors.

Reference is now made to FIG. 4 that depicts a schematic diagram 400 of a PA stage having nonlinear capacitances at multiple nodes in the stacked cascode structure and respective compensation capacitors. The last driving stage 410 has a nonlinear output capacitance 412 that is affected by the output voltage of the driving stage 410. Therefore an optional driver output capacitance equalization 416 inversely affected by the diving stage 412 output voltage may be added. The cascode stage comprises of a plurality of gates, 420, 430 and 440 each having a respective nonlinear output capacitance 422, 432 and 442, each being affected by a respective output voltage swing. In accordance with the invention the main nonlinear equalization capacitance 446 is used to compensate for the dominating output capacitance, as explained in detail hereinabove. The equalization capacitors 426 and 436 are optional each dealing with a lesser output capacitive load linearization requirement than that which is required to linearize the main output capacitance 442. As noted above, the total capacitor resulting from the nonlinear output capacitance and the compensating inverse voltage coefficient output equalization capacitor, for example the equivalent capacitor formed from the parallel connection of capacitors 442 and 446, may have a small ripple versus voltage as a result of an approximate equalization. In another embodiment each compensation capacitor may be realized as a combination of nonlinear capacitors that see a better approximation of the PA nonlinear output capacitance. This can be very useful when the output signal suffers of large pulse width distortion, e.g., the voltage spends little time at peak values.

Figure 5:
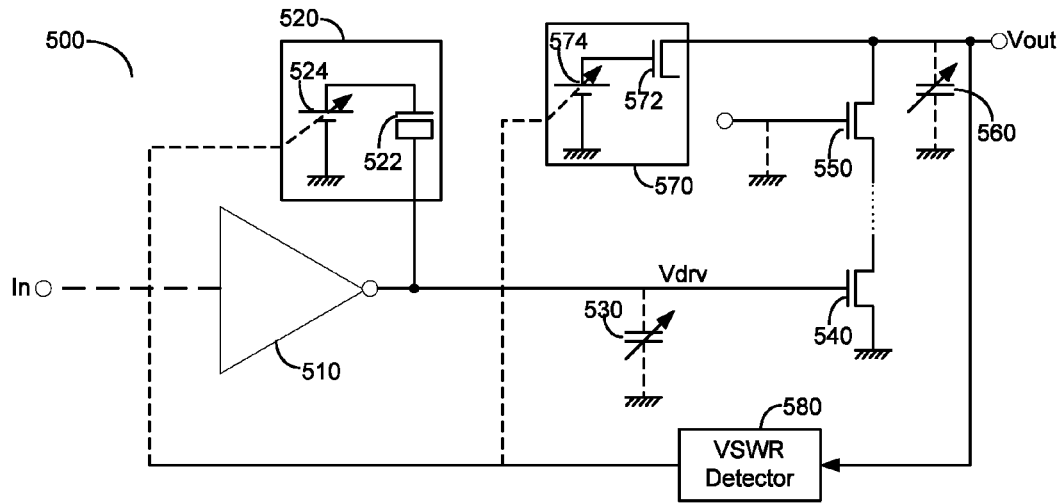
FIG. 5 is a schematic diagram of a PA signal path implemented with a nonlinear capacitance equalization.

FIG. 5 depicts an exemplary and non-limiting schematic diagram 500 of a PA signal path implemented with nonlinear capacitance equalization and in accordance with the principles of the invention. Since the most nonlinear capacitances appear in the last two stages of the signal path, i.e., the last driving stage 510 and the output stage comprised of at least the transistors 540 and 550, due to the large signal swing, these are the stages where the equalization efforts are focused. However, this should not be viewed as limiting the scope of the invention and earlier stages may be compensated using similar principles that are disclosed herein.

The nonlinear output capacitance Cout(Vout) 560, which increases as the Vout voltage decreases, and as shown hereinabove, is compensated by compensation unit 570 with a PFET gate 572 capacitance that has an inverse variation. At high Vout voltages the PFET is in inversion and brings a large capacitance, while at low Vout voltages the PFET turns off and shows a low equivalent capacitance. The gate of PFET 572 may be connected to a supply voltage $Vcomp_{out}$ 574 which sets the Vout voltage when the PFET transitions from OFF to ON state. This voltage may be adjustable, offering an additional degree of freedom.

The nonlinear input capacitance Cin(Vdrv) 530, affected by the output voltage of the driving stage 510, is equalized using equalization circuit 520, having an NFET 522, the gate of which is connected to a $Vcomp_{in}$ supply voltage 524. At low Vdrv voltages, i.e., the output voltage from the driving stage 510, when the FET 540 is OFF and shows a low input capacitance, the NFET 522 is ON in strong inversion and shows a large equivalent capacitance. At high Vdrv voltage, when the FET 540 is ON and shows a large input capacitance, the NFET 522 is OFF, showing a low equivalent capacitance. Here to, $Vcomp_{in}$ 524 maybe adjustable in order to get better nonlinear capacitance equalization. In one embodiment of the invention the bias voltages $Vcomp_{in}$ 524 and $Vcomp_{out}$ 574 can be controlled by a VSWR detector which senses the values of the load impedance. Such an arrangement utilizes the capacitance equalization over a wide load impedance range improving the linearity performance over varying load impedances.

It would be appreciated by those of ordinary skill in the art and in view of the invention descriptions herein, that there are many ways to realize a non-linear capacitance equalization block and the scope of the invention should not be limited to those examples provided herein. As is well-known in the art, most active devices demonstrate some form of nonlinear capacitance including diodes (diode junction capacitance), bipolar transistors and MOS transistors. For the capacitance equalization network implementation circuits using bipolar diodes, MOS structures (MOS inversion capacitance and MOS accumulation capacitance) and/or switched capacitor networks may be considered. The simpler the network is the better its reliability and robustness. Also, since the total PA output capacitance needs to be minimized, it is advantageous to use devices or solutions that have a large Cmax/Cmin ratio.

Figure 6:
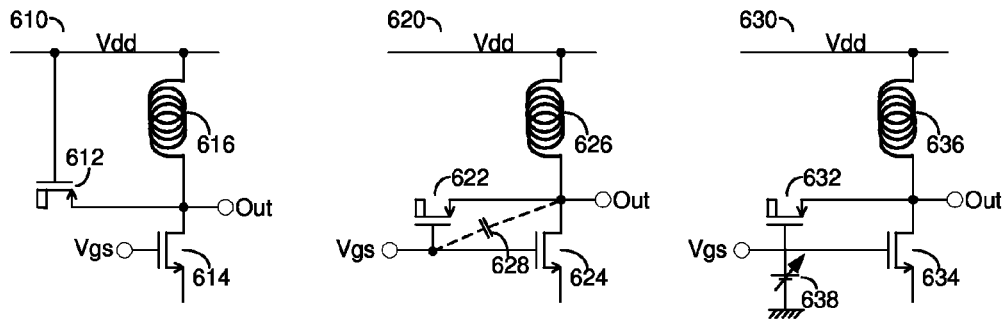
FIG. 6 shows three examples of compensation capacitor biasing to be used in accordance with the principles of the invention.

Reference is now made to FIG. 6 that shows three exemplary and non-limiting circuits 610, 620 and 630 of compensation capacitor biasing to be used in accordance with the principles of the invention. In circuit 610 the compensation inversion PMOS 612 capacitance is connected from the output node of the positive supply Vdd. This ensures that a very small percentage of the output waveform cycle for which the PMOS 612 compensates is in inversion and thus presents a large capacitance. The single drawback is that this connection may result in a larger voltage stress on the PFET 612. In circuit 620 the PMOS 622 acts as an equalization device and connected between the output and the gate of NMOS 624. This configuration can give a good tradeoff between equalization depth and the voltage overstress. Circuit 630 shows the PMOS 632 acting as the equalization device, connected from the output to a special designed Vbias voltage. Its main advantage is the optional flexibility and controllability of the compensation capacitance which can be changed through analog or digital control signals. Although it is possible to shorten the drain and source of the compensation device it is best to leave the drain and bulk floating and thus minimizing the parasitic capacitance that loads the PA output. This also gives a larger Cmax/Cmin ratio.

Figure 7:
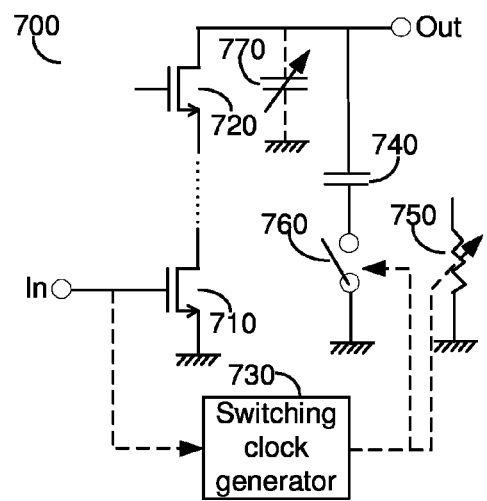
FIG. 7 is a nonlinear PA output capacitance equalization circuit using binary switched capacitance.
Figure 8:
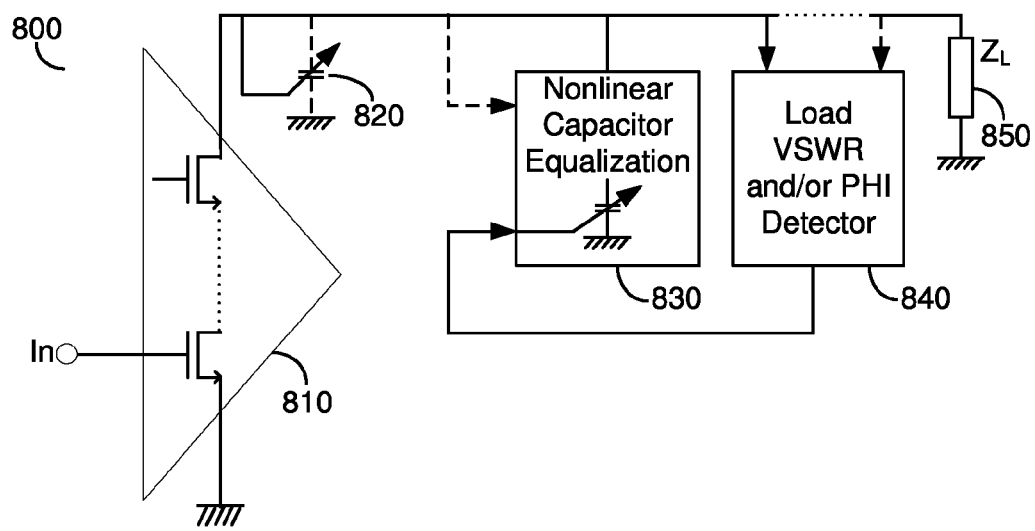
FIG. 8 is a PA stage with capacitor equalization dependent on the load impedance value.

One of the simplest ways to provide an approximate equalization of the PA nonlinear output capacitance is using two value binary switching capacitance values. The equalization capacitance has a first large value capacitance and a second smaller value capacitance. The switching between the two value occurs at a given threshold voltage Vth. The lower capacitance value can be equal to zero or whatever minimal parasitic capacitance that a switching network can ensure. Such a solution is shown with respect of the exemplary and non-limiting FIG. 7, demonstrating a nonlinear PA output capacitance equalization circuit using binary switched capacitance implemented in accordance with principles of the invention. The switch 760, under the control of a switching clock generator 730, connects or disconnects the capacitor 740 from the output of the PA having a cascode of at least devices 710 and 720. The capacitor 770 represents the equivalent nonlinear capacitance of the PA output. As may be necessary the switching clock generator 730 may implement a hysteresis to improve the binary capacitance switching characteristics. To reduce the efficiency degradation due to the capacitance equalization, the current level in the equalization leg needs to be minimized. Using a sharp switching between the capacitance levels can result in significant degradation of the PA performance. As an alternative, individual switching of multiple capacitors can be used, to form a nonlinear digital capacitive digital-to-analog convertor (DAC). A better implementation is to use a continuous switching controlled by the RF signal itself. These various nonlinear capacitances are referred to in the claims as a nonlinear analog capacitance, a nonlinear mixed signal capacitance and a nonlinear digital capacitance FIG. 8 depicts and exemplary and non-limiting PA stage 810 with capacitor equalization dependent on the load impedance value. The load impedance value is detected by the VSWR and/or phase, PHI, detector 840. The resulting signal is used to control the value of the equalization capacitance 830, to linearize the nonlinear output capacitance 820. The load impedance variation is a slow moving process and therefore both a continuous and even a switched capacitor (digital) equalization capacitor adjustment can be used. In addition to the load dependence, the equalization capacitance may also have a PA output voltage dependence.

The PA nonlinear output capacitance usually has a secondary dependence on environment conditions such as temperature, supply voltage value and also process corner. A multi control port equalization capacitance can be built to compensate also for these variations. Any combinations of such controlled compensation capacitors are possible. Since both OA output capacitance and equalization capacitance have a strong dependence on the signal duty-cycle, special measures need to be taken to minimize the duty-cycle variation, or otherwise compensate for it.

While the disclosed invention is described hereinabove with respect to specific exemplary embodiments, it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor.

What is claimed is:

1. A power amplifier (PA) system comprising:
a signal path comprising a plurality of gain stages;
an output stage the input of which is coupled to the output of the last gain stage of the signal path, the output stage having a nonlinear output capacitance; and
a capacitance equalization block connected to the output of the output stage that at least approximately compensates for the nonlinearity of the output stage output capacitance;
such that the total output capacitance of the PA is essentially constant.

2. The PA system of claim 1, further comprising:
a capacitance equalization block connected to at least the last gain stage of the signal path.

3. The PA system of claim 1, wherein the capacitance equalization block comprises at least one of: a nonlinear analog capacitance, a nonlinear mixed signal capacitance, a nonlinear digital capacitance.

4. The PA system of claim 3, wherein the nonlinear analog capacitance comprises at least one of: diode junction capacitance, MOS inversion capacitance, MOS accumulation capacitance.

5. The PA system of claim 3, wherein the nonlinear mixed-signal capacitance comprises at least one of: a sharply switched capacitance, a continuously switched capacitance.

6. The PA system of claim 3, wherein the nonlinear digital capacitance comprises at least one of: switched capacitor, capacitive digital-to-analog convertor (DAC).

7. The PA system of claim 6, wherein the capacitor DAC is used to implement a piecewise linear approximation of a nonlinear capacitance.

8. The PA system of claim 1, wherein the capacitance equalization block is controlled by at least one of: an output voltage from the output stage, an input voltage to the output stage, an impedance of a load connected to the output stage, temperature, supply voltage, process corner, a detector.

9. The PA system of claim 1, further comprising:
a voltage standing-wave ratio (VSWR) detector that controls the capacitance equalization block respective of detection of a load connected to the output of the PA system.

10. The PA system of claim 1 wherein the signal path is a radio frequency signal path.

* * * * *